US010418726B2

(12) United States Patent
Yukawa et al.

(10) Patent No.: US 10,418,726 B2
(45) Date of Patent: Sep. 17, 2019

(54) BUS BAR CONNECTION STRUCTURE

(71) Applicant: Panasonic Intellectual Property Management Co., Ltd., Osaka (JP)

(72) Inventors: Junichi Yukawa, Kanagawa (JP); Tatehiko Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/084,000

(22) PCT Filed: Oct. 13, 2016

(86) PCT No.: PCT/JP2016/004566
§ 371 (c)(1),
(2) Date: Sep. 11, 2018

(87) PCT Pub. No.: WO2017/158662
PCT Pub. Date: Sep. 21, 2017

(65) Prior Publication Data
US 2019/0260143 A1 Aug. 22, 2019

(30) Foreign Application Priority Data

Mar. 16, 2016 (JP) .................... 2016-052118

(51) Int. Cl.
*H01R 4/38* (2006.01)
*H01R 4/58* (2006.01)
*H01R 12/51* (2011.01)
(52) U.S. Cl.
CPC .............. *H01R 4/38* (2013.01); *H01R 4/58* (2013.01); *H01R 12/51* (2013.01)
(58) Field of Classification Search
CPC ............. H01R 4/38; H01R 12/51; H01R 4/58
(Continued)

(56) References Cited

U.S. PATENT DOCUMENTS 3,966,296 A * 6/1976 Ericson .................. H01R 4/302
439/801
4,679,888 A * 7/1987 Williams ............... H01R 4/302
439/801
(Continued)

FOREIGN PATENT DOCUMENTS

JP 2012-227038 11/2012

OTHER PUBLICATIONS

International Search Report of PCT application No. PCT/JP2016/004566 dated Jan. 10, 2017.

*Primary Examiner* — Abdullah A Riyami
*Assistant Examiner* — Nelson R. Burgos-Guntin
(74) *Attorney, Agent, or Firm* — Greenblum & Bernstein, P.L.C.

(57) ABSTRACT

A bus bar connection structure includes a housing, a circuit board including metal, and a bus bar that are disposed in order from a lower side, a lower nut including metal and disposed in an upper surface-side of the housing in a state in which the lower nut is embedded in the housing, and a bolt including metal. On an upper surface of the circuit board, an insulation layer and a copper foil pattern are formed in order from a lower side. An insulation paper piece is disposed between the lower nut and the circuit board. The bolt is screwed into the lower nut in a state in which the bolt is inserted through the insulation paper piece, the circuit board, the insulation layer, the copper foil pattern, and the bus bar. A rotation-preventing part is further provided, the rotation-preventing part preventing the insulation paper piece from rotating due to torque generated during fastening of the bolt.

24 Claims, 9 Drawing Sheets

(58) Field of Classification Search
USPC .......................................... 439/78, 721, 801
See application file for complete search history.

(56) References Cited

U.S. PATENT DOCUMENTS

| | | | |
|---|---|---|---|
| 6,280,263 B1* | 8/2001 | Manor ................... | H01R 11/12 |
| | | | 439/801 |
| 6,692,314 B1* | 2/2004 | Pares Caselles ......... | H01R 9/18 |
| | | | 439/521 |
| 7,892,049 B1* | 2/2011 | Andler .................... | H01R 4/34 |
| | | | 439/801 |
| 8,523,505 B2* | 9/2013 | Opper .................... | H01R 4/302 |
| | | | 411/377 |
| 2009/0068873 A1* | 3/2009 | Kulig ...................... | H01R 4/26 |
| | | | 439/321 |
| 2011/0293998 A1* | 12/2011 | Sato ................... | H01M 2/1077 |
| | | | 429/159 |
| 2012/0071024 A1* | 3/2012 | Yu ........................... | H01R 9/24 |
| | | | 439/540.1 |
| 2014/0087599 A1* | 3/2014 | Schumacher ............ | H01R 4/44 |
| | | | 439/801 |
| 2015/0171408 A1* | 6/2015 | Naganawa .............. | H01M 2/30 |
| | | | 429/182 |

* cited by examiner

BUS BAR CONNECTION STRUCTURE

This application is a U.S. national stage application of the PCT International Application No. PCT/JP2016/004566 filed on Oct. 13, 2016, which claims the benefit of foreign priority of Japanese patent application No. 2016-052118 filed on Mar. 16, 2016, the contents all of which are incorporated herein by reference.

TECHNICAL FIELD

The technology disclosed in the present description is related to a bus bar connection structure.

BACKGROUND ART

Bus bar connection structures for connecting bus bars to pattern wiring on circuit boards are known as conventional technology. Among conventional bus bar connection structures, there is a bus bar connection structure for connecting a bus bar to pattern wiring on a circuit board with a screw (for example, see PTL 1). This bus bar connection structure includes: a circuit board; a bus bar; a fixing body; a screw; and a metal bushing. The fixing body includes: a fixing base; and a metal nut into which the screw is screwed. The circuit board and the bus bar are disposed between a head part of the screw and the fixing body. The metal bushing is attached to a through-hole provided in the circuit board and is soldered to the through-hole. The screw penetrates the bus bar and the metal bushing without being screwed into the bus bar or the metal bushing. The bus bar and the metal bushing are placed one on top of another so as to be electrically conductive with respect to one another. In the bus bar connection structure configured as described above, by the screw being screwed into the metal nut, the bus bar is electrically connected to pattern wiring on the circuit board and is mechanically connected to the circuit board.

CITATION LIST

Patent Literature

PTL 1: Unexamined Japanese Patent Publication No. 2012-227038

SUMMARY OF THE INVENTION

The technology disclosed in the present description includes: a fixing member; a circuit board including metal, the circuit board disposed on a surface of the fixing member; a bus bar disposed on a surface of the circuit board opposite a surface of the circuit board on which the fixing member is disposed; a lower nut including metal, the lower nut disposed in an upper surface-side of the fixing member in a state in which the lower nut is embedded in the fixing member, when a position at which the fixing member is disposed is regarded as a lower direction and a position at which the bus bar is disposed is regarded as an upper direction; and a bolt including metal. On the upper surface of the circuit board, an insulation layer and a metal pattern are formed in order from a lower side. An insulation paper piece is disposed between the lower nut and the circuit board or between the bus bar and a head part of the bolt. The bolt is screwed into the lower nut in a state in which the bolt is inserted through the insulation paper piece, the circuit board, the insulation layer, the metal pattern, and the bus bar. A rotation-preventing part is disposed in contact with the insulation paper piece, the rotation-preventing part preventing the insulation paper piece from rotating due to torque generated during fastening of the bolt.

Further, the technology disclosed in the present description includes: a fixing member; a circuit board including metal, the circuit board disposed on a surface of the fixing member; a bus bar disposed on a surface of the circuit board opposite a surface of the circuit board on which the fixing member is disposed; a stud bolt including metal, the stud bolt erected on an upper surface-side of the fixing member, when a position at which the fixing member is disposed is regarded as a lower direction and a position at which the bus bar is disposed is regarded as an upper direction; and an upper nut including metal. On the upper surface of the circuit board, an insulation layer and a metal pattern are formed in order from a lower side. An insulation paper piece is disposed between the bus bar and the upper nut. The upper nut is screwed onto the stud bolt, the stud bolt inserted through the circuit board, the insulation layer, the metal pattern, the bus bar, and the insulation paper piece. A rotation-preventing part is disposed in contact with the insulation paper piece, the rotation-preventing part preventing the insulation paper piece from rotating due to torque generated during fastening of the upper nut.

According to the technology disclosed in the present description, the insulation paper piece is disposed between the lower nut and the circuit board or between the bus bar and the head part of the bolt, or between the bus bar and the upper nut, and thus, even if the insulation paper piece becomes hot in a state in which compressive stress is being exerted on the insulation paper piece, the insulation paper piece is unlikely to undergo plastic deformation due to characteristics of the insulation paper piece itself and thus loosening of the bolt due to thermal shock is unlikely to occur. Thus, sufficient electrical connection of the bus bar to the metal pattern of the circuit board and sufficient mechanical connection of the bus bar to the circuit board can be achieved.

Further, the insulation paper piece does not rotate even when the bolt or the upper nut rotates, because the rotation-preventing part, which prevents the insulation paper piece from rotating due to the torque generated during fastening, is provided. Thus, the insulation paper piece is fixed between the lower nut and the circuit board or between the bus bar and the head part of the bolt, or between the bus bar and the upper nut, without positional displacement of the insulation paper piece.

Further, the insulation paper piece does not rotate even when the bolt or the upper nut rotates, and thus, tearing of the insulation paper piece that may unfortunately occur when the insulation paper piece is fastened while rotating can be suppressed. Thus, insulation breakdown occurring due to such tearing can be suppressed.

DESCRIPTION OF EMBODIMENTS

Prior to describing exemplary embodiments, problems found in conventional technology will now briefly be described herein. In the bus bar connection structure indicated in PTL 1, when the circuit board is configured by using a metal circuit board for effective dissipation of heat generated at the circuit board, a current would flow from the bus bar to the metal circuit board if no measure were to be taken, because the metal nut contacts the metal circuit board via the metal bushing by the screw being screwed into the metal nut.

In order to ensure that a current does not flow from the bus bar to the metal circuit board, a measure of disposing a resin insulation body between the metal nut and the metal circuit board can be conceived, for example.

In such a bus bar connection structure, compressive force is exerted onto the resin insulation body because the bus bar is mechanically connected to the metal circuit board by the screw being screwed into the metal nut. When the resin insulation body becomes hot in this state, the resin insulation body undergoes plastic deformation, and as a result, there is a risk of the screw loosening and sufficient electrical connection of the bus bar to the pattern wiring on the circuit board and sufficient mechanical connection of the bus bar to the circuit board not being achieved.

The technology disclosed in the present description has been made in view of such points, and the problem to be solved by the technology disclosed in the present description is achieving sufficient electrical connection of the bus bar to the metal pattern on the circuit board and sufficient mechanical connection of the bus bar to the circuit board.

Hereinafter, exemplary embodiments will be described in detail with reference to the drawings.

First Exemplary Embodiment

Figure 1:
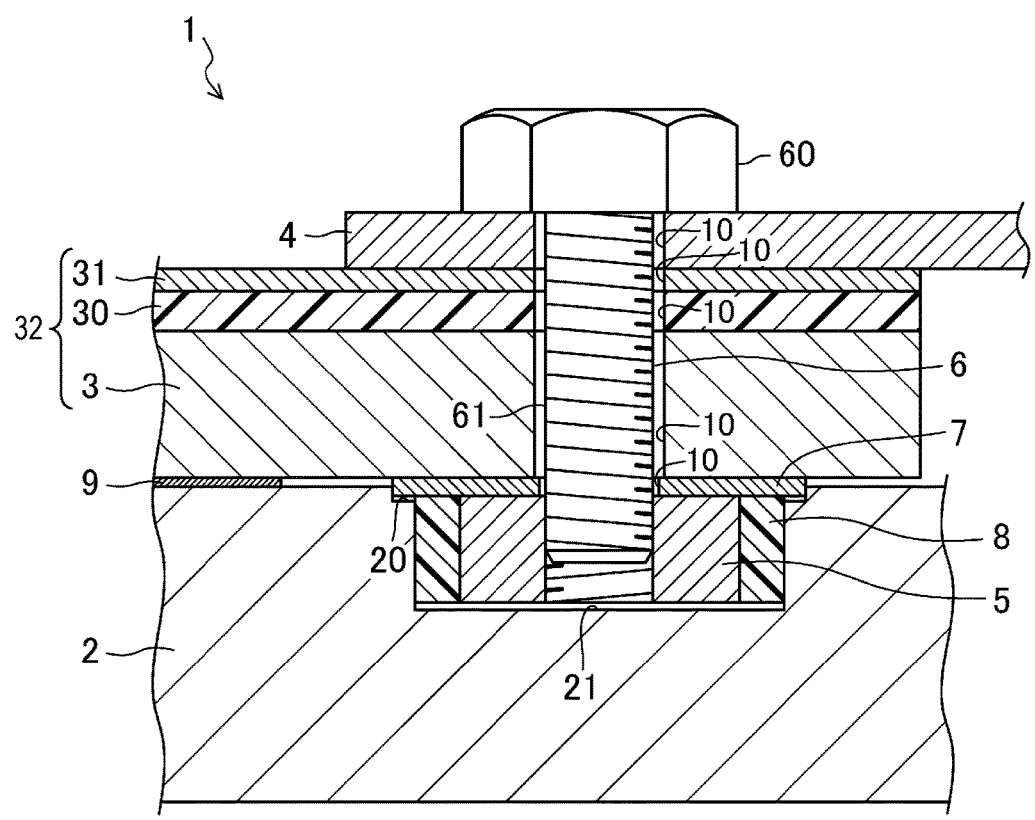
FIG. 1 is a schematic cross-sectional view illustrating a bus bar connection structure pertaining to a first exemplary embodiment.
Figure 2:
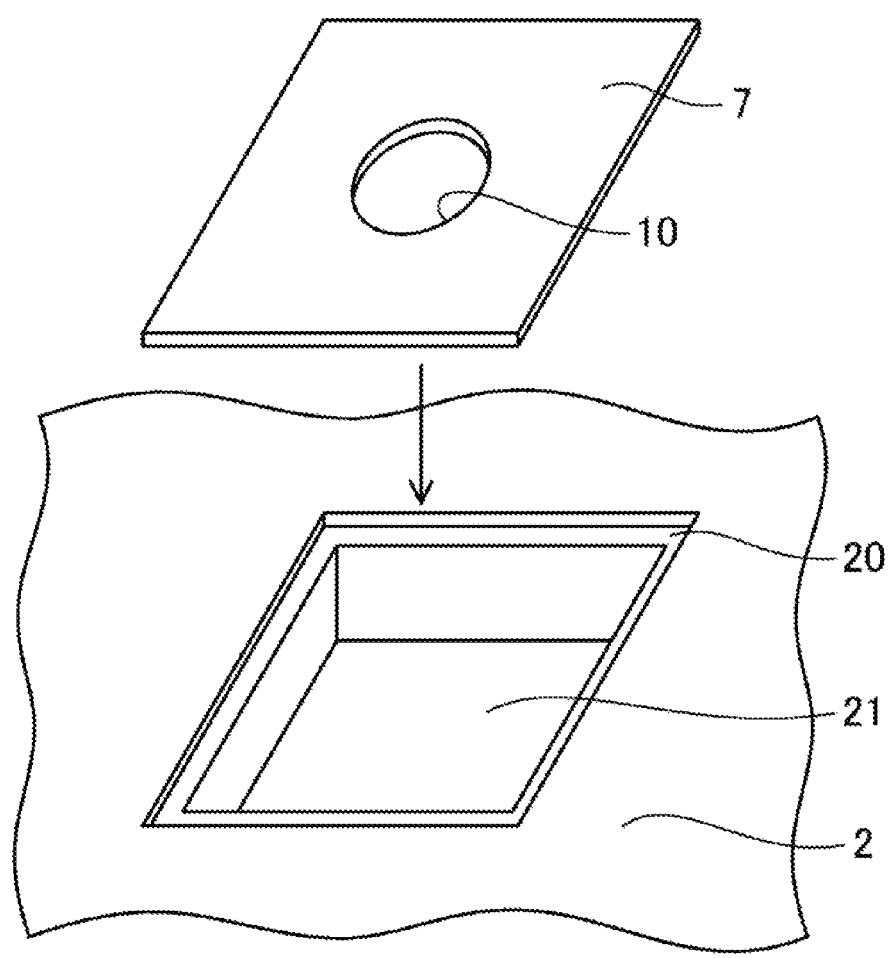
FIG. 2 is a schematic perspective view illustrating shapes of an insulation paper piece and a rotation-preventing recess part and a positional relationship between the insulation paper piece and the rotation-preventing recess part.
Figure 3:
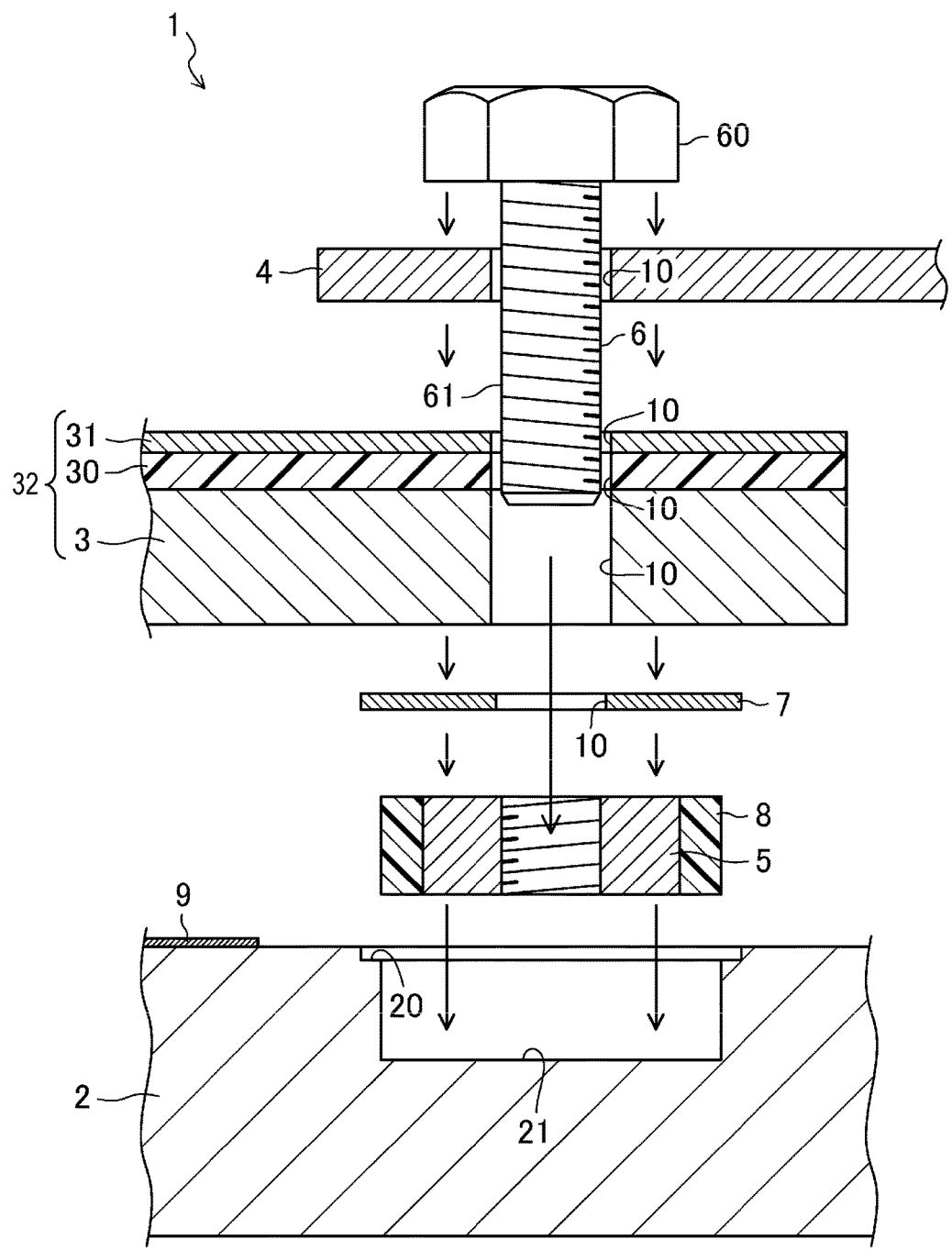
FIG. 3 is a schematic exploded cross-sectional view illustrating the bus bar connection structure.

FIG. 1 is a schematic cross-sectional view illustrating a bus bar connection structure pertaining to the first exemplary embodiment. FIG. 2 is a schematic perspective view illustrating shapes of an insulation paper piece and a rotation-preventing recess part and a positional relationship between the insulation paper piece and the rotation-preventing recess part. FIG. 3 is a schematic exploded cross-sectional view illustrating the bus bar connection structure. Note that FIGS. 1 to 3 are exaggerated for convenience in making the drawings easy to see.

Bus bar connection structure 1 includes: metal housing 2 (fixing member; simply referred to as "housing" hereinafter); aluminum circuit board 32 (metal circuit board; simply referred to as "circuit board" hereinafter); bus bar 4; metal lower nut 5; metal bolt 6 (simply referred to as "bolt" hereinafter) having head part 60 and a screw part; and electrical-insulation paper piece 7 (simply referred to as "insulation paper piece" hereinafter).

Circuit board 32 is disposed on a surface (first surface of housing 2) of housing 2. Bus bar 4 is disposed on a surface (first surface of circuit board 32) of circuit board 32 opposite a surface (second surface of circuit board 32) of circuit board 32 on which housing 2 is disposed. Hereinafter, the position at which housing 2 is disposed is defined as a lower direction and the position at which bus bar 4 is disposed is defined as an upper direction. Accordingly, housing 2, circuit board 32, and bus bar 4 are disposed in the stated order from a lower side. Housing 2 is a metal case. Accordingly, housing 2 has a function of effectively dissipating heat generated at circuit board 32. Housing 2 is at a ground potential. Rotation-preventing recess part 20 (rotation-preventing part) is formed in the upper surface of housing 2 at a portion corresponding to a portion at which insulation paper piece 7 is disposed. Rotation-preventing recess part 20 is a step-like counterbore hole formed to have a mutually-complementing shape with respect to insulation paper piece 7 (that is, a rectangular shape when viewed from an up-down direction).

Accommodating recess part (insertion recess part) 21 is formed at a bottom surface-side of rotation-preventing recess part 20 (upper surface-side of housing 2). When viewed from the up-down direction, accommodating recess part 21 is disposed inside rotation-preventing recess part 20. Accommodating recess part 21 is formed to have a mutually-complementing shape with respect to nut holder 8 (that is, a rectangular shape when viewed from the up-down direction). Nut holder 8 is a holding member that is made of resin and holds lower nut 5 inside. Nut holder 8 is formed to have a rectangular shape when viewed from the up-down direction. For example, lower nut 5 is a hexagonal nut. Lower nut 5 is formed integrally with nut holder 8 by insert molding. Nut holder 8 holding lower nut 5 inside is accommodated in fitting state (including loosely fitting state) in accommodating recess part 21 of housing 2. Thus, lower nut 5 is disposed in the upper surface-side of housing 2 in a state of being embedded in housing 2. There is a space between nut holder 8 holding lower nut 5 inside and a bottom surface of accommodating recess part 21, in a state in which bolt 6 is screwed into lower nut 5. This space ensures electrical insulation between lower nut 5 and housing 2.

Circuit board 32 is a board used for assembling an electronic component, etc., on circuit board 32. On an upper surface (first surface) of circuit board member 3 of circuit board 32, insulation layer 30 and copper foil pattern 31 (metal pattern) are formed in the stated order from a lower side. Bus bar 4 is a belt-shaped metal conductor used for applying a large current, for joining several circuits, etc.

Insulation paper piece 7 is disposed between lower nut 5 and circuit board 32 in a state in which insulation paper piece 7 is accommodated in rotation-preventing recess part 20 of housing 2. This ensures electrical insulation between lower nut 5 and circuit board 32. For example, insulation paper piece 7 is constituted of fine paper or craft paper that has black- or yellow-colored insulation varnish applied on both surfaces. Insulation paper piece 7 is press-molded. Insulation paper piece 7 is formed to have a rectangular shape. When seen from the up-down direction, insulation paper piece 7 is larger than nut holder 8. Grease 9 is disposed between housing 2 and circuit board 32 at portions other than a portion at which insulation paper piece 7 is disposed. Grease 9 has a function of transmitting heat generated at circuit board 32 to housing 2.

Screw insertion hole 10 is formed in each of insulation paper piece 7, circuit board 32, insulation layer 30, copper foil pattern 31, and bus bar 4, at a portion thereof corresponding to bolt 6 (portion corresponding to contact part of copper foil pattern 31 and bus bar 4). Screw insertion holes 10 are formed to have circular shapes. Screw insertion holes 10 in insulation paper piece 7, circuit board member 3, insulation layer 30, copper foil pattern 31, and bus bar 4 have bore diameters greater than an outer diameter of shaft part 61 of bolt 6. The bore diameters of screw insertion holes 10 in circuit board member 3, insulation layer 30, copper foil pattern 31, and bus bar 4 are substantially the same and are greater than the bore diameter of screw insertion hole 10 in insulation paper piece 7.

Further, shaft part 61 of bolt 6 is screwed into lower nut 5 in a state in which shaft part 61 is inserted through screw insertion holes 10 in insulation paper piece 7, circuit board member 3, insulation layer 30, copper foil pattern 31, and bus bar 4 with a space between shaft part 61 and each screw insertion hole 10. Thus, bus bar 4 is electrically connected to copper foil pattern 31 and is mechanically connected and fixed to circuit board 32, and is electrically insulated from circuit board 32.

The following describes a connection procedure of bus bar 4.

First, nut holder 8 holding lower nut 5 is disposed to be accommodated in accommodating recess part 21 of housing 2 and insulation paper piece 7 is disposed to be accommodated in rotation-preventing recess part 20. Further, grease 9 is applied onto the upper surface of housing 2. Next, circuit board 32 having insulation layer 30 and copper foil pattern 31 formed on circuit board 32 is placed on the upper surface of housing 2, in a state in which screw insertion hole 10 in insulation paper piece 7 and screw insertion holes 10 in circuit board member 3, insulation layer 30, and copper foil pattern 31 are positionally aligned. Next, bus bar 4 is placed on an upper surface of copper foil pattern 31, in a state in which screw insertion holes 10 in insulation paper piece 7, circuit board member 3, insulation layer 30, and copper foil pattern 31 and screw insertion hole 10 in bus bar 4 are positionally aligned.

Next, bolt 6 is inserted through screw insertion holes 10 in insulation paper piece 7, circuit board member 3, insulation layer 30, copper foil pattern 31, and bus bar 4 and is fastened to lower nut 5.

Here, rotation-preventing recess part 20 of housing 2 has been formed to have a mutually-complementing shape with respect to insulation paper piece 7 having a rectangular shape. Thus, even if a splinter were to be formed on an inner circumferential surface of screw insertion hole 10 in insulation paper piece 7 during press-molding and the splinter were to contact bolt 6 during the fastening of bolt 6, insulation paper piece 7 would not rotate along with the rotation of bolt 6 because insulation paper piece 7 contacts rotation-preventing recess part 20.

Then, once head part 60 of bolt 6 contacts copper foil pattern 31, nut holder 8 holding lower nut 5 is lifted up as bolt 6 rotates. The fastening is complete after this.

Hence, bus bar 4 is electrically connected to copper foil pattern 31 and mechanically connected to circuit board 32. Further, insulation paper piece 7 does not rotate due to rotational torque generated during the fastening of bolt 6, and thus positional displacement of insulation paper piece 7 does not occur.

Effects

Hence, according to the present exemplary embodiment, insulation paper piece 7 is disposed between lower nut 5 and circuit board 32, and thus, even if insulation paper piece 7 becomes hot in a state in which compressive stress is being exerted on insulation paper piece 7, insulation paper piece 7 is unlikely to undergo plastic deformation due to characteristics of insulation paper piece 7 itself and thus loosening of bolt 6 due to thermal shock is unlikely to occur. Thus, sufficient electrical connection of bus bar 4 to copper foil pattern 31 of circuit board 32 and sufficient mechanical connection of bus bar 4 to circuit board 32 can be achieved.

Further, rotation-preventing recess part 20 is formed in the upper surface of housing 2 at the portion corresponding to the portion at which insulation paper piece 7 is disposed, rotation-preventing recess part 20 is formed to have a mutually-complementing shape with respect to rectangular insulation paper piece 7, and insulation paper piece 7 is disposed inside rotation-preventing recess part 20. Thus, even if a splinter were to be formed on the inner circumferential surface of screw insertion hole 10 in insulation paper piece 7 during press-molding and the splinter were to contact bolt 6 during the fastening of bolt 6, insulation paper piece 7 would not rotate along with the rotation of bolt 6 because insulation paper piece 7 contacts rotation-preventing recess part 20. Thus, insulation paper piece 7 is fixed between lower nut 5 and circuit board 32 without positional displacement of insulation paper piece 7.

Further, insulation paper piece 7 does not rotate even when bolt 6 rotates, and thus, tearing of insulation paper piece 7 that may unfortunately occur when insulation paper piece 7 is fastened while rotating can be suppressed. Thus, insulation breakdown occurring due to such tearing can be suppressed.

Further, nut holder 8 does not rotate along with the rotation of bolt 6 during the fastening of bolt 6 because nut holder 8 is formed to have a rectangular shape when viewed from the up-down direction, accommodating recess part 21 is formed in the upper surface-side of housing 2 to have a mutually-complementing shape with respect to nut holder 8, and nut holder 8 holding lower nut 5 inside is accommodated in accommodating recess part 21. Thus, bolt 6 can be screwed into lower nut 5 to a sufficient extent.

Further, nut holder 8 is constituted of resin, and thus, electrical insulation between housing 2 and nut holder 8 can be achieved.

Further, grease 9 is disposed between housing 2 and circuit board 32 at portions other than the portion at which insulation paper piece 7 is disposed, and thus, even if a gap were to be formed between housing 2 and circuit board 32 due to insulation paper piece 7 being disposed between lower nut 5 and circuit board 32, heat generated at circuit board 32 can be transmitted to housing 2 to a sufficient extent via grease 9.

Note that while insulation paper piece 7 is formed to have a rectangular shape in the present exemplary embodiment, it suffices for insulation paper piece 7 to be formed to have a shape that is not a circular shape. For example, insulation paper piece 7 may be formed to have a polygonal shape other than a quadrilateral shape, or an elliptical shape. This means that it suffices for insulation paper piece 7 to have a shape such that insulation paper piece 7 does not rotate along with the rotation of bolt 6 during the fastening of bolt 6. That is, it suffices for insulation paper piece 7 to have a shape enclosed by an outer shape with straight lines or an outer shape with different curvatures, or to have a shape having a contour with different curvatures.

Further, while rotation-preventing recess part 20 is formed only in the upper surface of housing 2, rotation-preventing recess part 20 may be formed only in a lower surface of circuit board 32 or in both the upper surface of housing 2 and the lower surface of circuit board 32.

Second Exemplary Embodiment

The present exemplary embodiment differs from the first exemplary embodiment in terms of the position at which the insulation paper piece is disposed and the structure of the rotation-preventing part but has a structure similar to the first exemplary embodiment in other regards. Accordingly, in the description below, redundant description regarding components similar to the components in the first exemplary embodiment may be omitted.

Figure 4:
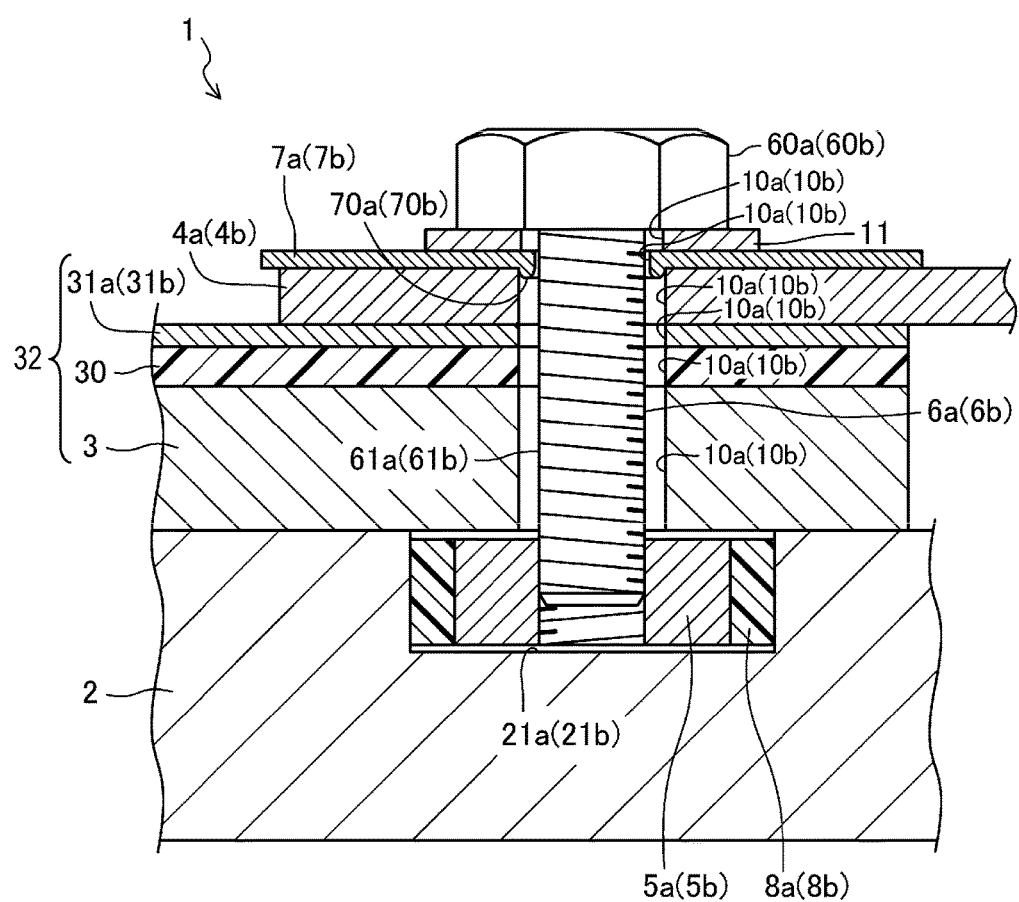
FIG. 4 is a schematic cross-sectional view illustrating a bus bar connection structure pertaining to a second exemplary embodiment.
Figure 5:
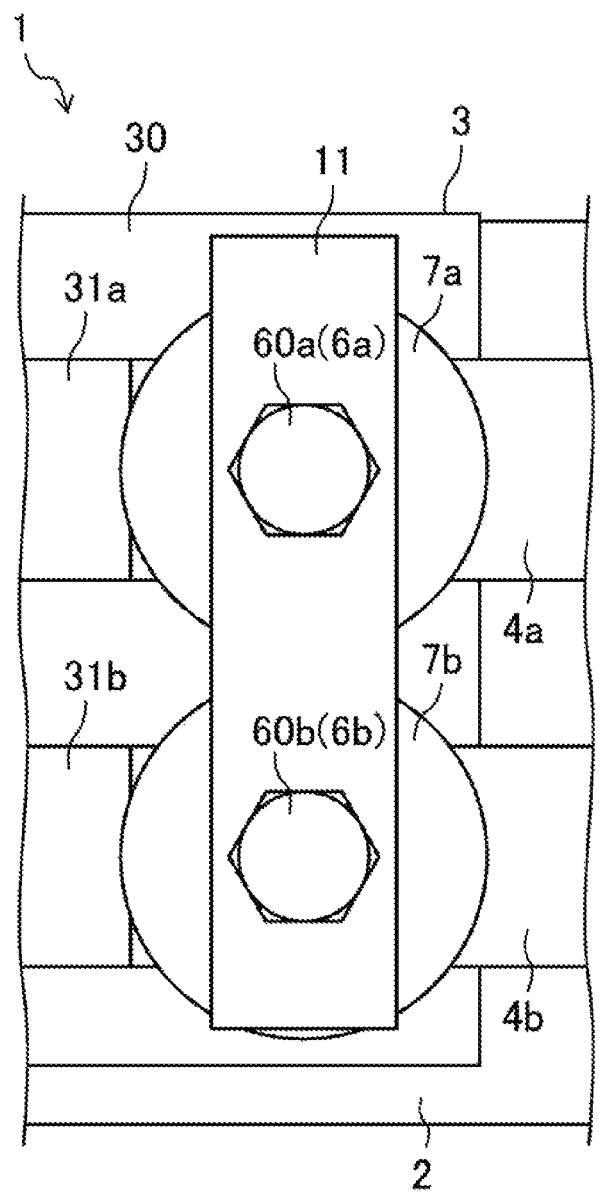
FIG. 5 is a schematic plan view illustrating the bus bar connection structure.

FIG. 4 is a schematic cross-sectional view illustrating a bus bar connection structure pertaining to the second exemplary embodiment. FIG. 5 is a schematic plan view illustrating the bus bar connection structure. Note that FIGS. 4 and 5 are exaggerated for convenience in making the drawings easy to see. Further, in the following description, for convenience in facilitating the description, the "top", "bottom", "left", and "right" in FIG. 5 are respectively referred to as the "front", "rear", "left", and "right" of the bus bar connection structure.

Bus bar connection structure 1 includes: housing 2; circuit board 32; first bus bar 4a and second bus bar 4b; first lower nut 5a and second lower nut 5b; first bolt 6a and second bolt 6b; and first insulation paper piece 7a and second insulation paper piece 7b.

In an upper surface of housing 2, first accommodating recess part 21a and second accommodating recess part 21b are disposed side-by-side along a front-rear direction. First accommodating recess part 21a and second accommodating recess part 21b are formed to have mutually-complementing shapes with respect to first nut holder 8a and second nut holder 8b, respectively. First nut holder 8a is a holding member that holds first lower nut 5a inside. Second nut holder 8b is a holding member that holds second lower nut 5b inside. First nut holder 8a holding first lower nut 5a inside is accommodated in fitting state in first accommodating recess part 21a of housing 2, and second nut holder 8b holding second lower nut 5b inside is accommodated in fitting state in second accommodating recess part 21b.

On an upper surface of circuit board 32, insulation layer 30 and copper foil patterns (first copper foil pattern 31a and second copper foil pattern 31b) are formed in the stated order from a lower side. First copper foil pattern 31a and second copper foil pattern 31b are disposed side-by-side along the front-rear direction. First copper foil pattern 31a and second copper foil pattern 31b each extend along the left-right direction.

First insulation paper piece 7a is disposed between first bus bar 4a and head part 60a of first bolt 6a, and second insulation paper piece 7b is disposed between second bus bar 4b and head part 60b of second bolt 6b. This achieves electrical insulation between first and second bus bars 4a, 4b and bolts 6a, 6b. Insulation paper pieces 7a, 7b are each formed to have a circular shape. When viewed from the up-down direction in FIG. 4, insulation paper pieces 7a, 7b are greater than head parts 60a, 60b of bolts 6a, 6b.

Laterally-long washer 11 (rotation-preventing part, rotation-preventing washer) is disposed between first insulation paper piece 7a and head part 60a of first bolt 6a and between second insulation paper piece 7b and head part 60b of second bolt 6b in a state in which first bolt 6a and second bolt 6b are inserted through laterally-long washer 11. Thus, head parts 60a, 60b do not directly contact insulation paper pieces 7a, 7b during fastening of bolts 6a, 6b. Laterally-long washer 11 is used for the fastening of two bolts 6a, 6b. Thus, laterally-long washer 11 itself does not rotate during the fastening. Laterally-long washer 11 is formed to have a rectangular shape extending along the front-rear direction. Further, laterally-long washer 11 is electrically insulated from first and second bus bars 4a, 4b because laterally-long washer 11 is disposed in contact with insulation paper pieces 7a, 7b, and thus, laterally-long washer 11 is configured to be made of metal, which is unlikely to undergo plastic deformation due to thermal shock.

First screw insertion hole 10a is formed in each of circuit board member 3, insulation layer 30, first copper foil pattern 31a, first bus bar 4a, first insulation paper piece 7a, and laterally-long washer 11 at a portion corresponding to first bolt 6a (portion corresponding to contact part of first copper foil pattern 31a and first bus bar 4a). First screw insertion holes 10a are formed to have circular shapes. First screw insertion holes 10a in circuit board member 3, insulation layer 30, first copper foil pattern 31a, first bus bar 4a, first insulation paper piece 7a, and laterally-long washer 11 have bore diameters greater than an outer diameter of first bolt 6a. The bore diameters of first screw insertion holes 10a in circuit board member 3, insulation layer 30, first copper foil pattern 31a, and first bus bar 4a are substantially the same and are greater than the bore diameter of first screw insertion hole 10a in first insulation paper piece 7a.

Further, shaft part 61a of first bolt 6a is screwed into first lower nut 5a in a state in which shaft part 61a is inserted through first screw insertion holes 10a in circuit board member 3, insulation layer 30, first copper foil pattern 31a, first bus bar 4a, first insulation paper piece 7a, and laterally-long washer 11 with a space between shaft part 61a and each first screw insertion hole 10a. Thus, first bus bar 4a is electrically connected to first copper foil pattern 31a and is mechanically connected and fixed to circuit board 32, and is electrically insulated from circuit board 32, first bolt 6a, and laterally-long washer 11.

Second screw insertion hole 10b is formed in each of circuit board member 3, insulation layer 30, second copper foil pattern 31b, second bus bar 4b, and laterally-long washer 11 at a portion corresponding to second bolt 6b (portion corresponding to contact part of second copper foil pattern 31b and second bus bar 4b). Second screw insertion holes 10b have structures similar to first screw insertion holes 10a. Further, shaft part 61b of second bolt 6b is screwed into second lower nut 5b in a state in which shaft part 61b is inserted through second screw insertion holes 10b in circuit board member 3, insulation layer 30, second copper foil pattern 31b, second bus bar 4b, and laterally-long washer 11 with a space between shaft part 61b and each second screw insertion hole 10b. Thus, second bus bar 4b is electrically connected to second copper foil pattern 31b and is mechanically connected and fixed to circuit board 32, and is electrically insulated from circuit board 32, second bolt 6b, and laterally-long washer 11.

First protruding part 70a (contact-preventing part) that protrudes downward is formed by embossing a circumferential edge part of first screw insertion hole 10a in first insulation paper piece 7a. First protruding part 70a is disposed between first bolt 6a and an inner circumferential surface of first screw insertion hole 10a in first bus bar 4a. This prevents first bus bar 4a and first bolt 6a from contacting one another. For example, first protruding part 70a is formed to have a circular shape when viewed from the up-down direction.

Second protruding part 70b (contact-preventing part) that protrudes downward is formed by embossing a circumferential edge part of second screw insertion hole 10b in second insulation paper piece 7b. Second protruding part 70b is disposed between second bolt 6b and an inner circumferential surface of second screw insertion hole 10b in second bus bar 4b. This prevents second bus bar 4b and second bolt 6b from contacting one another. For example, second protruding part 70b is formed to have a circular shape when viewed from the up-down direction.

The following describes a connection procedure of first bus bar 4a and second bus bar 4b.

First, first nut holder 8a holding first lower nut 5a is disposed to be accommodated in first accommodating recess part 21a of housing 2, and second nut holder 8b holding second lower nut 5b is disposed to be accommodated in second accommodating recess part 21b.

Next, circuit board 32 having insulation layer 30 and copper foil patterns 31a, 31b formed on circuit board 32 is placed on the upper surface of housing 2, in a state in which a screw hole of first lower nut 5a and first screw insertion holes 10a in circuit board member 3, insulation layer 30, and first copper foil pattern 31a are positionally aligned and a screw hole of second lower nut 5b and second screw insertion holes 10b in circuit board member 3, insulation layer 30, and second copper foil pattern 31b are positionally aligned.

Next, first bus bar 4a is placed on an upper surface of first copper foil pattern 31a, in a state in which first screw insertion holes 10a in circuit board member 3, insulation layer 30, and first copper foil pattern 31a and first screw insertion hole 10a in first bus bar 4a are positionally aligned. Further, second bus bar 4b is placed on an upper surface of second copper foil pattern 31b, in a state in which second screw insertion holes 10b in circuit board member 3, insulation layer 30, and second copper foil pattern 31b and second screw insertion hole 10b in second bus bar 4b are positionally aligned.

Next, first insulation paper piece 7a is placed on an upper surface of first bus bar 4a, in a state in which first screw insertion hole 10a in first bus bar 4a and first screw insertion hole 10a in first insulation paper piece 7a are positionally aligned and first protruding part 70a of first insulation paper piece 7a is disposed inside first screw insertion hole 10a in first bus bar 4a. Further, second insulation paper piece 7b is placed on an upper surface of second bus bar 4b, in a state in which second screw insertion hole 10b in second bus bar 4b and second screw insertion hole 10b in second insulation paper piece 7b are positionally aligned and second protruding part 70b of second insulation paper piece 7b is disposed inside second screw insertion hole 10b in second bus bar 4b.

Next, laterally-long washer 11 is placed on upper surfaces of first insulation paper piece 7a and second insulation paper piece 7b, in a state in which first screw insertion hole 10a in first insulation paper piece 7a and first screw insertion hole 10a in laterally-long washer 11 are positionally aligned and second screw insertion hole 10b in second insulation paper piece 7b and second screw insertion hole 10b in laterally-long washer 11 are positionally aligned.

Next, first bolt 6a is inserted through first screw insertion holes 10a in circuit board member 3, insulation layer 30, first copper foil pattern 31a, first bus bar 4a, first insulation paper piece 7a, and laterally-long washer 11, and second bolt 6b is inserted through second screw insertion holes 10b in circuit board member 3, insulation layer 30, second copper foil pattern 31b, second bus bar 4b, second insulation paper piece 7b, and laterally-long washer 11. Then, first bolt 6a and second bolt 6b are fastened to first lower nut 5a and second lower nut 5b, respectively.

Here, laterally-long washer 11 is used for the fastening of two bolts 6a, 6b, and thus, laterally-long washer 11 itself does not rotate during the fastening. Thus, while laterally-long washer 11 presses insulation paper pieces 7a, 7b downward during the fastening, rotational torque generated during the fastening is not exerted onto insulation paper pieces 7a, 7b. Thus, insulation paper pieces 7a, 7b do not rotate along with the rotation of bolts 6a, 6b.

Hence, first bus bar 4a is electrically connected to first copper foil pattern 31a and mechanically connected to circuit board 32. Further, second bus bar 4b is electrically connected to second copper foil pattern 31b and mechanically connected to circuit board 32. Further, insulation paper pieces 7a, 7b do not rotate due to the rotational torque generated during the fastening of bolts 6a, 6b, and thus positional displacement of insulation paper pieces 7a, 7b does not occur.

Effects

According to the above, the present exemplary embodiment provides operations and effects similar to the operations and effects of the first exemplary embodiment described above.

That is, insulation paper pieces 7a, 7b are disposed between first and second bus bars 4a, 4b and head parts 60a, 60b of bolts 6a, 6b, and thus, even if insulation paper pieces 7a, 7b become hot in a state in which compressive stress is being exerted on insulation paper pieces 7a, 7b, insulation paper pieces 7a, 7b are unlikely to undergo plastic deformation due to characteristics of insulation paper pieces 7a, 7b themselves and thus loosening of bolts 6a, 6b due to thermal shock is unlikely to occur. Thus, sufficient electrical connection of first and second bus bars 4a, 4b to copper foil patterns 31a, 31b of circuit board 32 and sufficient mechanical connection of first and second bus bars 4a, 4b to circuit board 32 can be achieved.

Further, laterally-long washer 11 is disposed between head parts 60a, 60b of bolts 6a, 6b and insulation paper pieces 7a, 7b in a state in which bolts 6a, 6b are inserted through laterally-long washer 11. Thus, while laterally-long washer 11 presses insulation paper pieces 7a, 7b downward during the fastening of bolts 6a, 6b, the rotational torque generated during the fastening is not exerted onto insulation paper pieces 7a, 7b. Thus, insulation paper pieces 7a, 7b do not rotate along with the rotation of bolts 6a, 6b. Thus, insulation paper pieces 7a, 7b are fixed between first and second bus bars 4a, 4b and head parts 60a, 60b of bolts 6a, 6b without positional displacement of insulation paper pieces 7a, 7b.

Further, insulation paper pieces 7a, 7b do not rotate along with the rotation of bolts 6a, 6b, and thus, tearing of insulation paper pieces 7a, 7b that may unfortunately occur when insulation paper pieces 7a, 7b are fastened while rotating can be suppressed. Thus, insulation breakdown occurring due to such tearing can be suppressed.

Further, protruding parts 70a, 70b of insulation paper pieces 7a, 7b are disposed between bolts 6a, 6b and inner circumferential surfaces of screw insertion holes 10a, 10b in first and second bus bars 4a, 4b, and thus, first and second bus bars 4a, 4b and bolts 6a, 6b do not contact one another. Thus, sufficient electrical insulation between first and second bus bars 4a, 4b and bolts 6a, 6b can be achieved.

Note that due to the presence of protruding parts 70a, 70b of insulation paper pieces 7a, 7b, electrical connection of bolts 6a, 6b with first and second bus bars 4a, 4b and copper foil patterns 31a, 31b of circuit board 32 is avoided. Accordingly, in place of lower nuts 5a, 5b, female screws into which bolts 6a, 6b are screwed may be directly formed at portions in housing 2 at which lower nuts 5a, 5b are disposed. In this case, bolts 6a, 6b and laterally-long washer 11 would be at ground potential. Such a structure makes lower nuts 5a, 5b and nut holders 8a, 8b unnecessary, and it becomes no longer necessary to provide accommodating recess parts 21a, 21b in housing 2. Thus, bus bar connection structure 1 can be simplified.

Note that the insulation paper piece and rotation-preventing part may be disposed between bus bar 4 and head part 60 of bolt 6 also in the first exemplary embodiment.

Third Exemplary Embodiment

The present exemplary embodiment differs from the second exemplary embodiment in terms of fastening members but has a structure similar to the second exemplary embodiment in other regards. Accordingly, in the description below, redundant description regarding components similar to the components in the second exemplary embodiment may be omitted.

Figure 6:
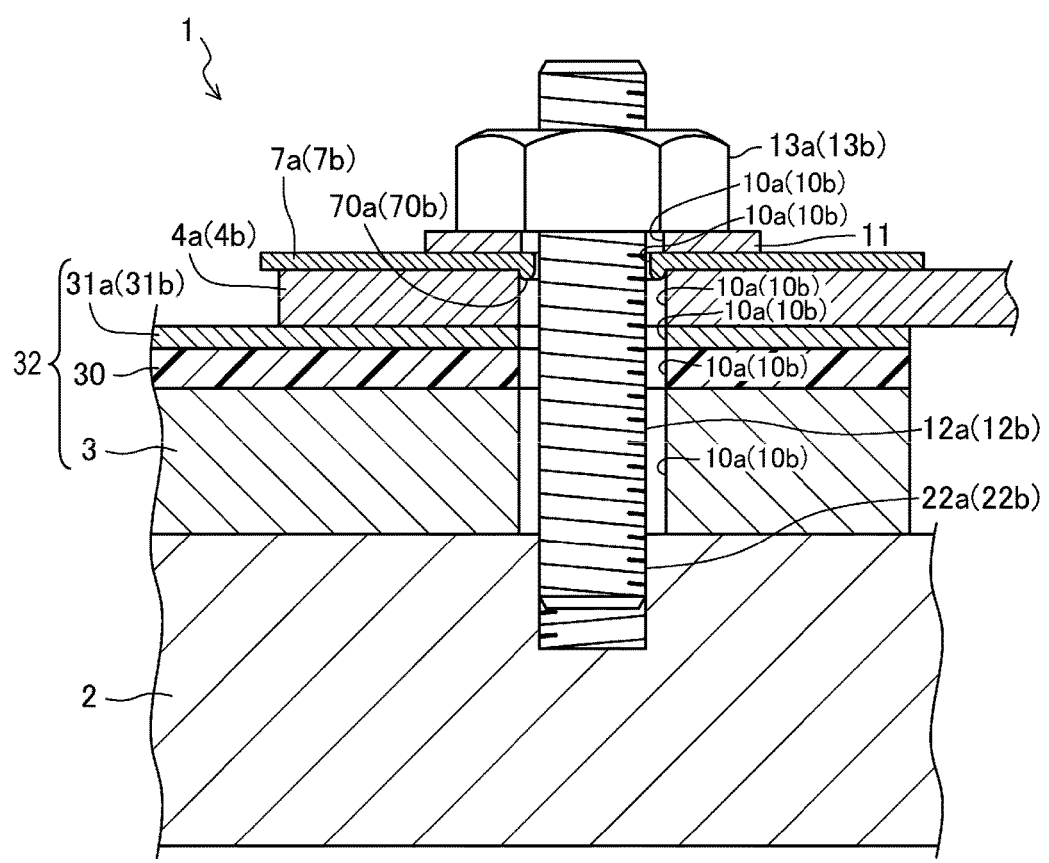
FIG. 6 is a schematic cross-sectional view illustrating a bus bar connection structure pertaining to a third exemplary embodiment.
Figure 7:
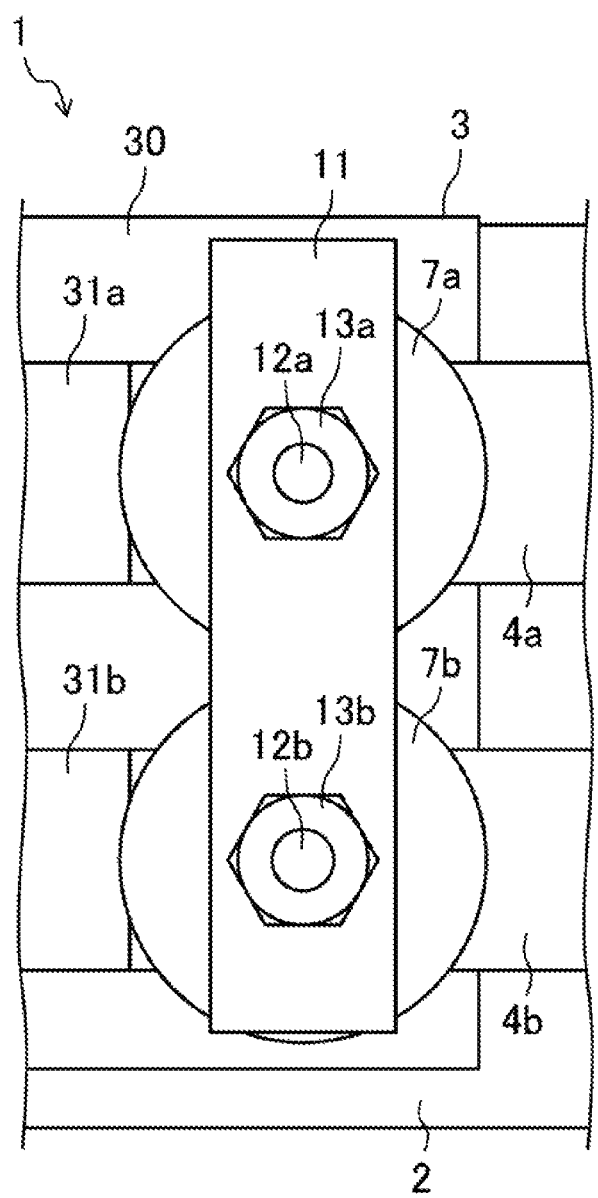
FIG. 7 is a schematic plan view illustrating the bus bar connection structure.

FIG. 6 is a schematic cross-sectional view illustrating a bus bar connection structure pertaining to the third exemplary embodiment. FIG. 7 is a schematic plan view illustrating the bus bar connection structure. Note that FIGS. 6 and 7 are exaggerated for convenience in making the drawings easy to see. Further, in the following description, for convenience in facilitating the description, the "top", "bottom", "left", and "right" in FIG. 7 are respectively referred to as the "front", "rear", "left", and "right" of the bus bar connection structure.

Bus bar connection structure 1 includes: housing 2; circuit board 32; first bus bar 4a and second bus bar 4b; first stud bolt 12a and second stud bolt 12b; first upper nut 13a and second upper nut 13b that are made of metal; and first insulation paper piece 7a and second insulation paper piece 7b.

First stud bolt 12a and second stud bolt 12b are metal bolts. First stud bolt 12a and second stud bolt 12b are disposed and fixed side-by-side along a front-rear direction with respect to an upper surface-side of housing 2 in a state in which first stud bolt 12a and second stud bolt 12b extend along the up-down direction, by first stud bolt 12a and second stud bolt 12b being screwed into female screws 22a, 22b formed in the upper surface of housing 2 in a state in which female screws 22a, 22b line up side-by-side along the front-rear direction. For example, first upper nut 13a and second upper nut 13b are hexagonal nuts.

First insulation paper piece 7a is disposed between first bus bar 4a and first upper nut 13a, and second insulation paper piece 7b is disposed between second bus bar 4b and second upper nut 13b. Thus, first and second bus bars 4a, 4b are electrically insulated from upper nuts 13a, 13b and stud bolts 12a, 12b. When viewed from the up-down direction, insulation paper pieces 7a, 7b are greater than upper nuts 13a, 13b.

Laterally-long washer 11 (rotation-preventing part, rotation-preventing washer) is disposed between first upper nut 13a and first insulation paper piece 7a and between second upper nut 13b and second insulation paper piece 7b in a state in which first stud bolt 12a and second stud bolt 12b are inserted through laterally-long washer 11. Hence, laterally-long washer 11 is disposed in contact with insulation paper pieces 7a, 7b, and thus upper nuts 13a, 13b do not directly contact insulation paper pieces 7a, 7b during fastening of upper nuts 13a, 13b.

First screw insertion hole 10a is formed in each of circuit board member 3, insulation layer 30, first copper foil pattern 31a, first bus bar 4a, first insulation paper piece 7a, and laterally-long washer 11 at a portion corresponding to first stud bolt 12a (portion corresponding to contact part of first copper foil pattern 31a and first bus bar 4a). First screw insertion holes 10a are formed to have circular shapes. First screw insertion holes 10a in circuit board member 3, insulation layer 30, first copper foil pattern 31a, first bus bar 4a, first insulation paper piece 7a, and laterally-long washer 11 have bore diameters greater than an outer diameter of first stud bolt 12a. The bore diameters of first screw insertion holes 10a in circuit board 32, insulation layer 30, first copper foil pattern 31a, and first bus bar 4a are substantially the same and are greater than the bore diameter of first screw insertion hole 10a in first insulation paper piece 7a.

Further, first upper nut 13a is screwed onto first stud bolt 12a inserted through first screw insertion holes 10a in circuit board member 3, insulation layer 30, first copper foil pattern 31a, first bus bar 4a, first insulation paper piece 7a, and laterally-long washer 11 with a space between first stud bolt 12a and each first screw insertion hole 10a. Thus, first bus bar 4a is electrically connected to first copper foil pattern 31a and is mechanically connected and fixed to circuit board 32, and is electrically insulated from circuit board 32, laterally-long washer 11, first stud bolt 12a, and first upper nut 13a. Further, circuit board 32, laterally-long washer 11, first stud bolt 12a, and first upper nut 13a are at the potential (ground potential) of housing 2.

Second screw insertion hole 10b is formed in each of circuit board member 3, insulation layer 30, second copper foil pattern 31b, second bus bar 4b, second insulation paper piece 7b, and laterally-long washer 11 at a portion corresponding to second stud bolt 12b (portion corresponding to contact part of second copper foil pattern 31b and second bus bar 4b). Second screw insertion holes 10b have structures similar to first screw insertion holes 10a. Further, second upper nut 13b is screwed onto second stud bolt 12b inserted through second screw insertion holes 10b in circuit board member 3, insulation layer 30, second copper foil pattern 31b, second bus bar 4b, second insulation paper piece 7b, and laterally-long washer 11 with a space between second stud bolt 12b and each second screw insertion hole 10b. Thus, second bus bar 4b is electrically connected to second copper foil pattern 31b and is mechanically connected and fixed to circuit board 32, and is electrically insulated from circuit board 32, laterally-long washer 11, second stud bolt 12b, and second upper nut 13b. Further, second stud bolt 12b and second upper nut 13b, as well as circuit board 32 and laterally-long washer 11, are at the potential (ground potential) of housing 2.

Further, first upper nut 13a is screwed onto first stud bolt 12a inserted through first screw insertion holes 10a in circuit board 3, insulation layer 30, first copper foil pattern 31a, first bus bar 4a, first insulation paper piece 7a, and laterally-long washer 11 with a space between first stud bolt 12a and each first screw insertion hole 10a. Thus, first bus bar 4a is electrically connected to first copper foil pattern 31a and is mechanically connected and fixed to circuit board 3, and is electrically insulated from circuit board 3, laterally-long washer 11, first stud bolt 12a, and first upper nut 13a. Further, circuit board 3, laterally-long washer 11, first stud bolt 12a, and first upper nut 13a are at the potential (ground potential) of housing 2.

Second screw insertion hole 10b is formed in each of circuit board 3, insulation layer 30, second copper foil pattern 31b, second bus bar 4b, second insulation paper piece 7b, and laterally-long washer 11 at a portion corresponding to second stud bolt 12b (portion corresponding to contact part of second copper foil pattern 31b and second bus bar 4b). Second screw insertion holes 10b have structures similar to first screw insertion holes 10a. Further, second upper nut 13b is screwed onto second stud bolt 12b inserted through second screw insertion holes 10b in circuit board 3, insulation layer 30, second copper foil pattern 31b, second bus bar 4b, second insulation paper piece 7b, and laterally-long washer 11 with a space between second stud bolt 12b and each second screw insertion hole 10b. Thus, second bus bar 4b is electrically connected to second copper foil pattern 31b and is mechanically connected and fixed to circuit board 3, and is electrically insulated from circuit board 3, laterally-long washer 11, second stud bolt 12b, and second upper nut 13b. Further, second stud bolt 12b and second upper nut 13b, as well as circuit board 3 and laterally-long washer 11, are at the potential (ground potential) of housing 2.

The following describes a connection procedure of first bus bar 4a and second bus bar 4b.

First, first stud bolt 12a and second stud bolt 12b are erected on the upper surface-side of housing 2.

Next, circuit board 32 having insulation layer 30 and copper foil patterns 31a, 31b formed on circuit board member 3 is placed on the upper surface of housing 2, in a state in which first stud bolt 12a is inserted through first screw insertion holes 10a in circuit board member 3, insulation layer 30, and first copper foil pattern 31a and second stud bolt 12b is inserted through second screw insertion holes 10b in circuit board member 3, insulation layer 30, and second copper foil pattern 31b.

Next, first bus bar 4a is placed on an upper surface of first copper foil pattern 31a in a state in which first stud bolt 12a is inserted through first screw insertion hole 10a in first bus bar 4a. Further, second bus bar 4b is placed on an upper surface of second copper foil pattern 31b in a state in which second stud bolt 12b is inserted through second screw insertion hole 10b in second bus bar 4b.

Next, first insulation paper piece 7a is placed on an upper surface of first bus bar 4a, in a state in which first stud bolt 12a is inserted through first screw insertion hole 10a in first insulation paper piece 7a and first protruding part 70a of first insulation paper piece 7a is disposed inside first screw insertion hole 10a in first bus bar 4a. Further, second insulation paper piece 7b is placed on an upper surface of second bus bar 4b, in a state in which second stud bolt 12b is inserted through second screw insertion hole 10b in second insulation paper piece 7b and second protruding part 70b of second insulation paper piece 7b is disposed inside second screw insertion hole 10b in second bus bar 4b.

Next, laterally-long washer 11 is placed on first insulation paper piece 7a and second insulation paper piece 7b, in a state in which first stud bolt 12a is inserted through first screw insertion hole 10a in laterally-long washer 11 and second stud bolt 12b is inserted through second screw insertion hole 10b in laterally-long washer 11.

Next, first upper nut 13a and second upper nut 13b are fastened to first stud bolt 12a and second stud bolt 12b, respectively.

Here, laterally-long washer 11 is used for the fastening of two stud bolts 12a, 12b, and thus, laterally-long washer 11 itself does not rotate during the fastening. Thus, while laterally-long washer 11 presses insulation paper pieces 7a, 7b downward during the fastening, rotational torque generated during the fastening is not exerted onto insulation paper pieces 7a, 7b. Thus, insulation paper pieces 7a, 7b do not rotate along with the rotation of upper nuts 13a, 13b.

Hence, first bus bar 4a is electrically connected to first copper foil pattern 31a and mechanically connected to circuit board 32. Further, second bus bar 4b is electrically connected to second copper foil pattern 31b and mechanically connected to circuit board 32. Further, insulation paper pieces 7a, 7b do not rotate due to the rotational torque generated during the fastening, and thus positional displacement of insulation paper pieces 7a, 7b does not occur.

Effects

According to the above, the present exemplary embodiment provides operations and effects similar to the operations and effects of the second exemplary embodiment described above.

That is, insulation paper pieces 7a, 7b are disposed between first and second bus bars 4a, 4b and upper nuts 13a, 13b, and thus, even if insulation paper pieces 7a, 7b become hot in a state in which compressive stress is being exerted on insulation paper pieces 7a, 7b, insulation paper pieces 7a, 7b are unlikely to undergo plastic deformation due to characteristics of insulation paper pieces 7a, 7b themselves and thus loosening of upper nuts 13a, 13b due to thermal shock is unlikely to occur. Thus, sufficient electrical connection of first and second bus bars 4a, 4b to copper foil patterns 31a, 31b of circuit board 32 and sufficient mechanical connection of first and second bus bars 4a, 4b to circuit board 32 can be achieved.

Further, laterally-long washer 11 is disposed between upper nuts 13a, 13b and insulation paper pieces 7a, 7b in a state in which stud bolts 12a, 12b are inserted through laterally-long washer 11, and thus, laterally-long washer 11 itself does not rotate during the fastening of upper nuts 13a, 13b. Thus, while laterally-long washer 11 presses insulation paper pieces 7a, 7b downward during the fastening of upper nuts 13a, 13b, rotational torque generated during the fastening is not exerted onto insulation paper pieces 7a, 7b. Thus, insulation paper pieces 7a, 7b do not rotate along with the rotation of upper nuts 13a, 13b. Thus, insulation paper pieces 7a, 7b are fixed between first and second bus bars 4a, 4b and upper nuts 13a, 13b without positional displacement of insulation paper pieces 7a, 7b.

Further, insulation paper pieces 7a, 7b do not rotate along with the rotation of upper nuts 13a, 13b, and thus, tearing of insulation paper pieces 7a, 7b that may unfortunately occur when insulation paper pieces 7a, 7b are fastened while rotating can be suppressed. Thus, insulation breakdown occurring due to such tearing can be suppressed.

Further, protruding parts 70a, 70b of insulation paper pieces 7a, 7b are disposed between stud bolts 12a, 12b and inner circumferential surfaces of screw insertion holes 10a, 10b in first and second bus bars 4a, 4b, and thus, first and second bus bars 4a, 4b and stud bolts 12a, 12b do not contact one another. Thus, sufficient electrical insulation between first and second bus bars 4a, 4b and stud bolts 12a, 12b can be achieved.

Further, circuit board 32 is placed on the upper surface of housing 2 in a state in which first stud bolt 12a is inserted through first screw insertion hole 10a in circuit board 32 and second stud bolt 12b is inserted through second screw insertion hole 10b in circuit board 32, and thus, positioning of circuit board 32 can be performed with ease.

Other Exemplary Embodiments

In the exemplary embodiments described above, bolts 6, 6a, 6b, 12a, 12b are inserted through screw insertion holes 10, 10a, 10b in insulation paper pieces 7, 7a, 7b, circuit board member 3, insulation layer 30, copper foil patterns 31, 31a, 31b, and bus bars 4, 4a, 4b with spaces between bolts 6, 6a, 6b, 12a, 12b and screw insertion holes 10, 10a, 10b. In place of or in addition to this configuration, however, insulation coating may be provided to surfaces of bolts 6, 6a, 6b, 12a, 12b. This achieves sufficient electrical insulation between bus bars 4, 4a, 4b and bolts 6, 6a, 6b, 12a, 12b.

Further, in the exemplary embodiments described above, insulation paper pieces 7, 7a, 7b are constituted of paper to which insulation varnish is applied. However, insulation paper pieces 7, 7a, 7b are not limited to this as long as insulation paper pieces 7, 7a, 7b are constituted of what is commonly defined as insulation paper, and for example may be made of fiber.

Further, in the exemplary embodiments described above, rotation-preventing recess part 20 and laterally-long washer 11 are mentioned as rotation-preventing parts. However, the rotation-preventing parts are not limited to these as long as the rotation-preventing parts prevent insulation paper pieces 7, 7a, 7b from rotating due to rotational torque generated during fastening.

Further, in the first and second exemplary embodiments, nut holder 8 is formed to have a rectangular shape. However, it suffices for nut holder 8 to be formed to have a shape that is not a circular shape so that nut holder 8 does not rotate during fastening, and for example, may be formed to have a polygonal shape other than a quadrilateral shape, or an elliptical shape. That is, it suffices for nut holder 8 to have a shape enclosed by an outer shape with straight lines or an outer shape with different curvatures, or to have a shape having a contour with different curvatures.

Further, in the first and second exemplary embodiments, nut holder 8 is made of resin. However, nut holder 8 may be made of an insulation material other than resin.

Further, in the first and second exemplary embodiments, lower nut 5 is embedded in housing 2 in a state in which lower nut 5 is held inside nut holder 8. However, given that housing 2 is an insulation body, lower nut 5 may be embedded directly in housing 2.

Further, in the second and third exemplary embodiments, laterally-long washer 11 is mentioned as a rotation-preventing washer. However, the rotation-preventing washer is not limited to this as long as the rotation-preventing washer itself does not rotate during fastening. For example, the rotation-preventing washer may be configured as a washer that includes one bolt 6, 6a, 6b, 12a, 12b and is also used for fastening a plurality of other screws.

Figure 8:
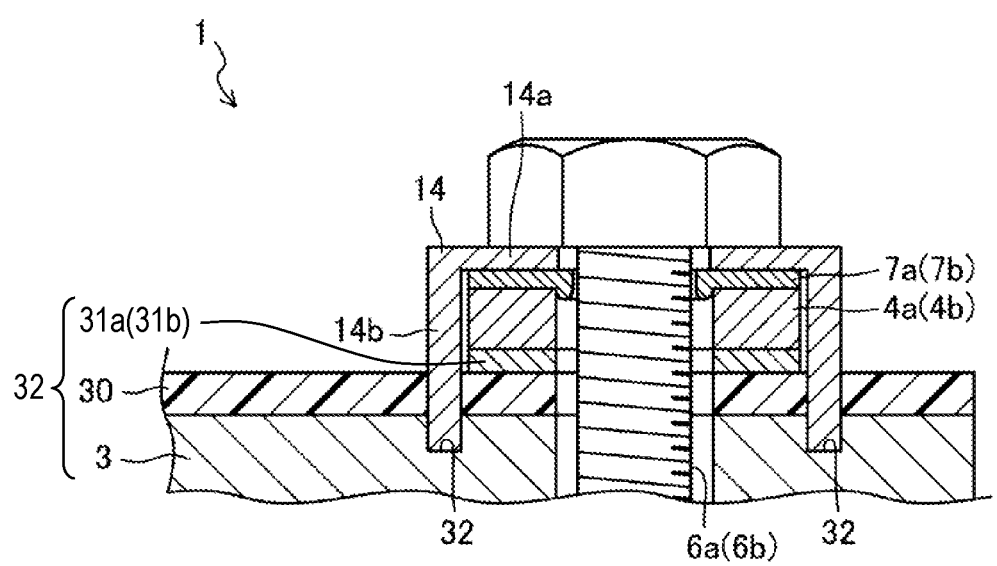
FIG. 8 is a schematic cross-sectional view illustrating a modification of a rotation-preventing washer.

Further, as illustrated in FIG. 8, the rotation-preventing washer may be configured as non-rotating washers 14 that each have: washer main body 14a having a plate-like shape (disc shape in the example in FIG. 8); and a plurality of engagement protrusions 14b that protrude downward from washer main body 14a and penetrate insulation layer 30 (two engagement protrusions 14b protruding from an outer peripheral edge part of washer main body 14a in the example in FIG. 8), and engagement recess parts 32 with which engagement protrusions 14b engage may be formed in the upper surface-side of circuit board 32 at portions that correspond to the respective ones of the engagement protrusions 14b. Note that FIG. 8 is exaggerated for convenience in making the drawing easy to see. According to this, non-rotating washers 14 themselves do not rotate during the fastening of bolts 6a, 6b, and thus operations and effects similar to the operations and effects of laterally-long washer 11 can be yielded.

Figure 9:
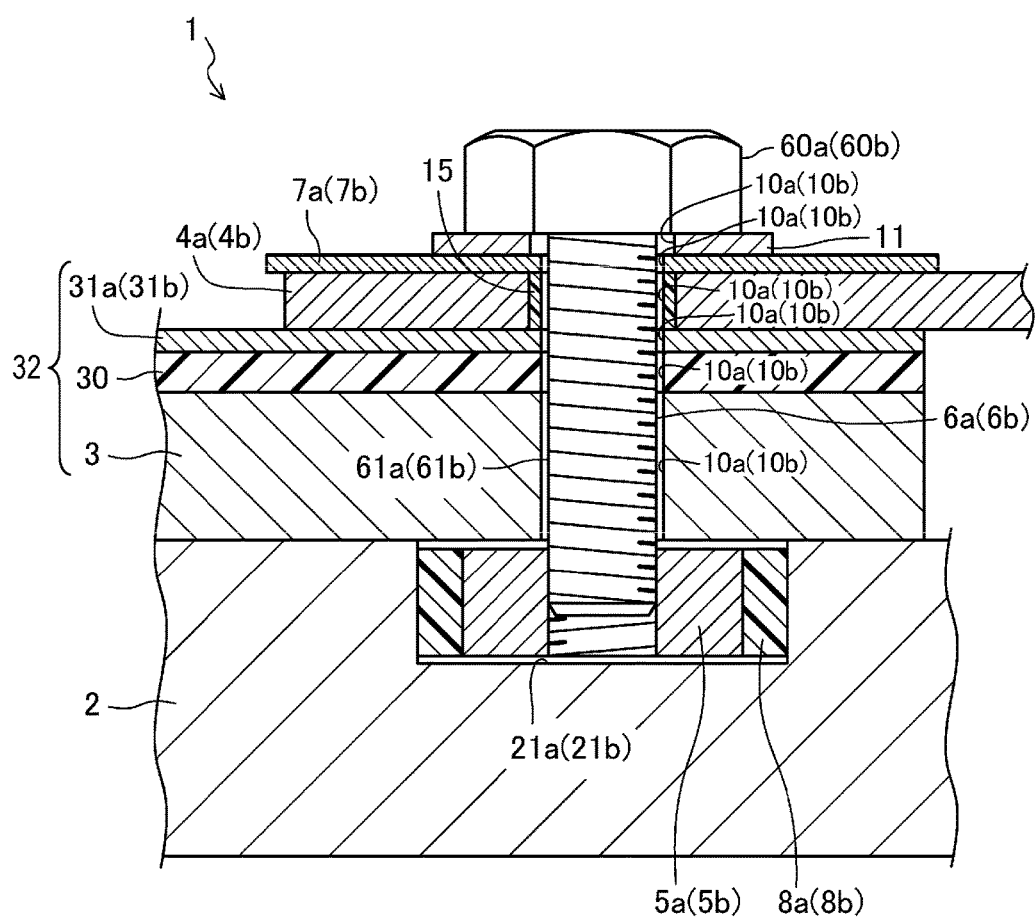
FIG. 9 is a view corresponding to FIG. 4 and illustrates a modification of contact-preventing parts.

Further, in the second and third exemplary embodiments, protruding parts 70a, 70b of insulation paper pieces 7a, 7b are mentioned as contact-preventing parts. However, the contact-preventing parts are not limited to these. For example, as illustrated in FIG. 9, the contact-preventing parts may be configured as insulation collars 15 disposed between inner circumferential surfaces of screw insertion holes 10a, 10b in first and second bus bars 4a, 4b and bolts 6a, 6b or stud bolts 12a, 12b. For example, insulation collars 15 are resin collars or ceramic collars. According to this, contact between first and second bus bars 4a, 4b and bolts 6a, 6b, 12a, 12b is avoided. Thus, sufficient electrical insulation between first and second bus bars 4a, 4b and bolts 6a, 6b, 12a, 12b can be achieved. Note that insulation collars 15 may be provided with a length reaching circuit board 32 and may be disposed in screw insertion holes 10a, 10b in circuit board 32.

Further, in the second and third exemplary embodiments, contact-preventing parts (protruding parts 70a, 70b) are provided. In place of or in addition to the contact-preventing parts, however, insulation paper pieces 7a, 7b may be bonded and fixed to first and second bus bars 4a, 4b. According to this, first and second bus bars 4a, 4b can be accurately positioned, and thus, contact between first and second bus bars 4a, 4b and bolts 6a, 6b, 12a, 12b is avoided. Thus, sufficient electrical insulation between first and second bus bars 4a, 4b and bolts 6a, 6b, 12a, 12b can be achieved.

The components in the exemplary embodiments described above may be combined, as appropriate, without departing from the scope of the technology disclosed in the present description.

INDUSTRIAL APPLICABILITY

As described up to this point, the bus bar connection structure pertaining to the technology disclosed in the present description is applicable to applications in which sufficient electrical connection of a bus bar to a metal pattern on a circuit board and sufficient mechanical connection of the bus bar to the circuit board need to be achieved, etc.

REFERENCE MARKS IN THE DRAWINGS 1 bus bar connection structure
2 housing (fixing member)
20 rotation-preventing recess part (rotation-preventing part)
21 accommodating recess part
3 circuit board
30 insulation layer
31 copper foil pattern (metal pattern)
4 bus bar
5 lower nut
6 bolt
7 insulation paper piece
70 protruding part (contact-preventing part)
8 nut holder (holding member)
9 grease
11 laterally-long washer (rotation-preventing part, rotation-preventing washer)
12 stud bolt
13 upper nut
14 non-rotating washer (rotation-preventing part, rotation-preventing washer)
15 insulation collar (contact-preventing part)

The invention claimed is:

1. A bus bar connection structure comprising:
a circuit board including metal, the circuit board having a first surface and a second surface at a reverse side of the first surface;
a circuit board member, an insulation layer and a metal pattern on the circuit board in order from the second surface toward the first surface;
a fixing member having a first surface that faces the second surface of the circuit board;
a bus bar in contact with the metal pattern;
a lower nut including metal, the lower nut being disposed in the first surface of the fixing member and being embedded in the fixing member;
a bolt that is including metal, the bolt having a head part and a screw part; and
an insulation paper piece disposed at at least one of a position between the lower nut and the circuit board and a position between the bus bar and the head part of the bolt,
wherein
the screw part of the bolt is inserted through the insulation paper piece, the circuit board member, the insulation layer, the metal pattern, and the bus bar and is screwed into the lower nut, and
the bus bar connection structure further comprising
a rotation-preventing part disposed to suppress rotation of the insulation paper piece due to rotational torque generated during fastening of the bolt.

2. A bus bar connection structure comprising:
a circuit board including metal, the circuit board having a first surface and a second surface at a reverse side of the first surface;
a circuit board member, an insulation layer and a metal pattern on the circuit board in order from the second surface toward the first surface;
a fixing member having a first surface that faces the second surface of the circuit board;
a bus bar in contact with the metal pattern;
a stud bolt that is including metal, the stud bolt being erected on the fixing member at the first surface of the fixing member;
an upper nut that is including metal, the upper nut being screwed onto the stud bolt;
an insulation paper piece disposed between the bus bar and the upper nut; and
a rotation-preventing part disposed in contact with the insulation paper piece,
wherein the stud bolt is inserted through the circuit board member, the insulation layer, the metal pattern, the bus bar, and the insulation paper piece, and
the rotation-preventing part suppresses rotation of the insulation paper piece due to rotational torque generated during fastening of the upper nut.

3. The bus bar connection structure according to claim 1, wherein
the insulation paper piece, when viewed from a normal direction of the first surface of the circuit board, has a polygonal shape or an elliptical shape, the insulation paper piece being disposed between the lower nut and the circuit board, and
the rotation-preventing part is a rotation-preventing recess part forming a mutually-complementing shape with respect to the insulation paper piece in at least one of the first surface of the fixing member and the second surface of the circuit board at a portion corresponding to a portion at which the insulation paper piece is disposed, the insulation paper piece being disposed inside the rotation-preventing recess part.

4. The bus bar connection structure according to claim 1, further comprising
a holding member that holds the lower nut at an inner side of the holding member,
wherein
the holding member, when viewed from a normal direction of the first surface of the fixing member, has a polygonal shape or an elliptical shape to suppress rotation of the holding member due to the rotational torque generated during the fastening of the bolt,
the first surface of the fixing member has an accommodating recess part having a mutually-complementing shape with respect to the holding member, and
the holding member is accommodated in the accommodating recess part of the fixing member.

5. The bus bar connection structure according to claim 4, wherein
the fixing member is including metal, and
the holding member is including an insulation material.

6. The bus bar connection structure according to claim 1, wherein
the insulation paper piece is disposed between the lower nut and the circuit board,
the fixing member is including metal, and
grease is disposed between the fixing member and the circuit board at at least some portion other than a portion at which the insulation paper piece is disposed.

7. The bus bar connection structure according to claim 1, wherein
the insulation paper piece is disposed between the bus bar and the head part of the bolt, and
the rotation-preventing part is a rotation-preventing washer that is disposed between the head part of the bolt and the insulation paper piece and being inserted through the rotation-preventing washer, the rotation-preventing part suppressing rotation of the rotation-preventing part due to the rotational torque generated during the fastening of the bolt.

8. The bus bar connection structure according to claim 7, wherein
the rotation-preventing washer includes a plurality of through-holes through which a plurality of screws including the bolt are inserted.

9. The bus bar connection structure according to claim 7, wherein
the rotation-preventing washer includes: a washer main body; and a plurality of engagement protrusions that protrude from the washer main body toward the first surface of the circuit board and penetrate the insulation layer, and
the first surface of the circuit board has a plurality of engagement recess parts with which the respective ones of the plurality of engagement protrusions engage.

10. The bus bar connection structure according to claim 1, wherein
the insulation paper piece is disposed between the bus bar and the head part of the bolt,
the bus bar includes an insertion hole through which the screw part of the bolt is inserted, and
the bus bar connection structure further comprising
a contact-preventing part disposed between the screw part of the bolt and an inner circumferential surface of the insertion hole, the contact-preventing part preventing contact between the inner circumferential surface and the screw part of the bolt.

11. The bus bar connection structure according to claim 10, wherein
the contact-preventing part is a protruding part that protrudes towards the first surface of the circuit board, the protruding part being a part of the insulation paper piece.

12. The bus bar connection structure according to claim 10, wherein
the contact-preventing part is an insulation collar.

13. The bus bar connection structure according to claim 1, wherein
the insulation paper piece is disposed between the bus bar and the head part of the bolt, and is bonded and fixed to the bus bar.

14. The bus bar connection structure according to claim 1, wherein
an insulation coating is applied onto a surface of the bolt.

15. The bus bar connection structure according to claim 2, wherein
the rotation-preventing part is a rotation-preventing washer that is disposed between the upper nut and the insulation paper piece and being inserted through the rotation-preventing washer, the rotation-preventing part suppressing rotation of the rotation-preventing part due to the rotational torque generated during the fastening of the upper nut.

16. The bus bar connection structure according to claim 15, wherein
the rotation-preventing washer includes a plurality of through-holes through which a plurality of screws including the stud bolt are inserted.

17. The bus bar connection structure according to claim 15, wherein
the rotation-preventing washer includes: a washer main body; and a plurality of engagement protrusions that protrude from the washer main body toward the first surface of the circuit board and penetrate the insulation layer, and
the first surface of the circuit board has a plurality of engagement recess parts with which the respective ones of the plurality of engagement protrusions engage.

18. The bus bar connection structure according to claim 2, wherein
the insulation paper piece is disposed between the bus bar and the upper nut,
the bus bar includes an insertion hole through which the stud bolt is inserted, and
the bus bar connection structure further comprising
a contact-preventing part disposed between the stud bolt and an inner circumferential surface of the insertion hole, the contact-preventing part preventing contact between the inner circumferential surface and the stud bolt.

19. The bus bar connection structure according to claim 18, wherein
the contact-preventing part is a protruding part that protrudes towards the first surface of the circuit board, the protruding part being a part of the insulation paper piece.

20. The bus bar connection structure according to claim 18, wherein
the contact-preventing part is an insulation collar.

21. The bus bar connection structure according to claim 2, wherein
the insulation paper piece is disposed between the bus bar and the upper nut, and is bonded and fixed to the bus bar.

22. The bus bar connection structure according to claim 2, wherein
an insulation coating is applied onto a surface of the stud bolt.

23. The bus bar connection structure according to claim 1, wherein
the insulation paper piece is disposed between the lower nut and the circuit board, and
the rotation-preventing part is disposed in the first surface of the fixing member and contacts the insulation paper piece to suppress the rotation of the insulation paper piece due to the rotational torque generated during the fastening of the bolt.

24. The bus bar connection structure according to claim 1, wherein
the insulation paper piece is disposed between the bus bar and the head part of the bolt, and
the rotation-preventing part is disposed between the insulation paper piece and the head part of the bolt so as to be in contact with the insulation paper piece and the head part of the bolt.

* * * * *